United States Patent [19]

Gotou et al.

[11] Patent Number: 4,621,371

[45] Date of Patent: Nov. 4, 1986

[54] METHOD OF FORMING BY PROJECTION AN INTEGRATED CIRCUIT PATTERN ON A SEMICONDUCTOR WAFER

[75] Inventors: Mineo Gotou, Kawasaki; Shunichi Sano, Zama, both of Japan

[73] Assignee: Tokyo Shibaura Denki Kabushiki Kaisha, Kawasaki, Japan

[21] Appl. No.: 594,731

[22] Filed: Mar. 29, 1984

[30] Foreign Application Priority Data

Mar. 29, 1983 [JP] Japan .................................. 58-52910
Mar. 29, 1983 [JP] Japan .................................. 58-52911

[51] Int. Cl.$^4$ ...................... H01J 37/304; G21K 5/04
[52] U.S. Cl. ................................. 378/34; 250/492.2;
250/492.3; 353/69; 378/35
[58] Field of Search ............... 250/492.2, 505.1, 492.1,
250/492.3; 378/34, 35; 430/296; 355/52;
353/69, 70, 121

[56] References Cited

U.S. PATENT DOCUMENTS

| | | | |
|---|---|---|---|
| 3,519,346 | 7/1970 | Robbins ............................... | 353/121 |
| 3,573,456 | 4/1971 | Beeh ................................. | 250/492.2 |
| 4,390,788 | 6/1983 | Hayashi et al. ................... | 250/492.2 |
| 4,455,067 | 6/1984 | Hoppmann et al. ................ | 353/69 |
| 4,463,265 | 7/1984 | Owen et al. ...................... | 250/492.2 |
| 4,504,558 | 3/1985 | Bohlen et al. ..................... | 250/492.2 |

OTHER PUBLICATIONS

Proceedings on the Symposium on Electron and Ion Beam Science and Technology: 9th Int. Conf., pp. 126–136: E-Beam Direct Writing in Manufacturing, R. D. Moore, 1980.

IBM J. of Res. and Development (Nov. 1977) pp. 507–513, Correction of Nonlinear Deflection Distortion in a Direct Exposure Electron-Beam System; H. Engelke et al.

*Primary Examiner*—Carolyn E. Fields
*Attorney, Agent, or Firm*—Oblon, Fisher, Spivak, McClelland & Maier

[57] ABSTRACT

A method of forming by projection an integrated circuit pattern on a first semiconductor wafer, wherein a plurality of reference marks are projected onto a second semiconductor wafer by the irradiation of radiant rays from a projector apparatus used to form the integrated circuit pattern onto the first semiconductor wafer. The positions of the reference marks projected onto the second semiconductor wafer are measured, thereby measuring the projection distortion peculiar to the projector apparatus. As the next step, a projection mask used to form the integrated circuit pattern is produced with the use of the measured projection distortions which has a distortion opposite that of the projector so as to offset its projection distortion. The mark is mounted in the projector apparatus, and the radiant rays are irradiated onto the mask thus projecting the integrated circuit pattern onto the first semiconductor wafer.

10 Claims, 8 Drawing Figures

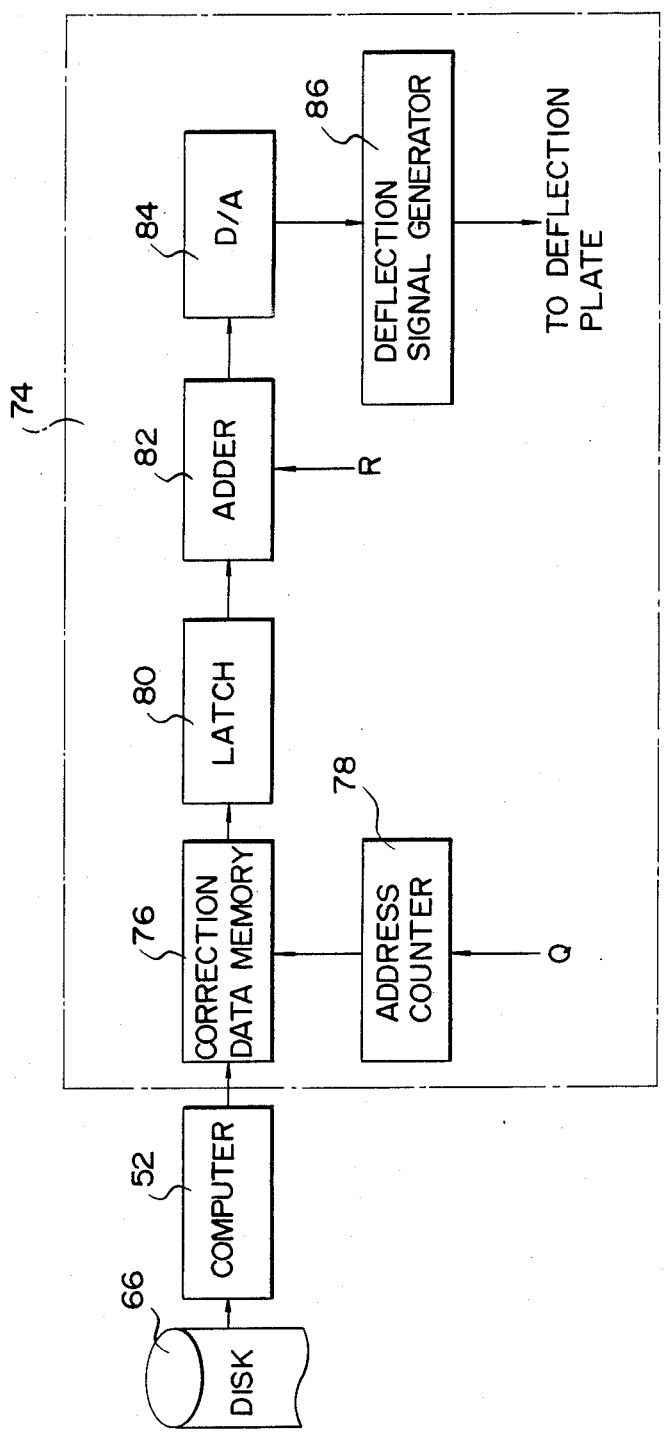
F I G. 7

METHOD OF FORMING BY PROJECTION AN INTEGRATED CIRCUIT PATTERN ON A SEMICONDUCTOR WAFER

BACKGROUND OF THE INVENTION

The present invention relates to a method of forming by projection an integrated circuit pattern on a semiconductor wafer and, more particularly, to a method of forming an integrated circuit pattern on a semiconductor wafer by irradiating it with a radiant beam which passes through a projecting mask for forming the integrated circuit pattern.

To manufacture a semiconductor integrated circuit, it is necessary to repeatedly form various integrated circuit patterns on a semiconductor wafer. A method of preforming a semiconductor integrated circuit pattern on a mask, of collectively projecting such a pattern onto the semiconductor wafer by the use of an optical projection technique and of exposing the same has hitherto been widely used. Since a large number of figures can be collectively formed using projection, it has the merit of being highly efficient.

Integrated circuits have recently become increasingly complex, as well as increasingly minute or fine. To further increase the degree of integration, therefore, it is necessary to form patterns with a higher precision. For example, when an integrated circuit pattern having a wire diameter of one to two microns is formed, a reduction projection aligner, or a reduction transfer apparatus is used to reduce the size of the pattern on a mask and to project the same onto a semiconductor wafer. This apparatus, indeed, makes it possible to form a pattern with a higher precision than that obtainable with a prior art projector apparatus having a projection ratio 1:1. However, this apparatus is expensive and small in through-put thus making the cost of pattern formation high. Because of this, a technique combining projector apparata to form patterns on the same semiconductor wafer is contemplated as a method of forming a highly precise pattern more cheaply.

However, whether or not one projector apparatus is interchangeable with another becomes an important question. Usually, each projector apparatus has its own level of distortion. Accordingly, when a pattern is projected on a wafer by a second projector apparatus, even more distortion or displacement occurs, resulting in decreased pattern precision. In order to solve this problem, it is necessary to remove the characteristic of projection distortion from each apparatus. Unfortunately, it is almost impossible to design a projector apparatus without any projection distortions. Therefore, two or more projector apparata are used only in combination when the distortion of patterns due to superposition falls within a permissible range. This greatly limits improving pattern formation efficiency.

SUMMARY OF THE INVENTION

In view of the above, the object of the present invention is to provide a method of projecting onto a semiconductor wafer an integrated circuit pattern which has the projection distortions peculiar to the projector apparatus removed.

Another object of the present invention is to provide a method of projecting an integrated circuit pattern which permits the combination of various projector apparata.

Still another object of the present invention is to provide a method of projecting an integrated circuit pattern with an enhanced pattern formation efficiency.

To attain the above object, the present invention provides a method of forming by projection an integrated circuit pattern on a first semiconductor wafer comprising the steps of: irradiating radiant rays onto a mask provided with a plurality of reference marks by the use of a projector apparatus which is used for forming the integrated circuit pattern on the first semiconductor wafer, thereby projecting said plurality of reference marks onto a second semiconductor wafer; measuring the projection distortions peculiar to said projector apparatus by measuring the positions of the reference marks projected onto the second semiconductor wafer; producing a projection mask for use in the formation of the integrated circuit pattern by the use of the measured projection distortion, said projection mask being formed to have the opposite distortion of the projector apparatus so as to offset its individual projection distortion; and mounting the projection mask in the projector apparatus so that it is irradiated with radiant rays, thereby projecting the integrated circuit pattern onto the first semiconductor wafer. The radiant rays are defined here in this specification to mean light beams, electron beams, X-ray beams, ion beams, etc.

As in the above-mentioned construction, the projection distortion is determined in advance and the opposite projection distortion is formed in the projection pattern on the mask. Thus, it is possible to project a less distorted integrated circuit pattern onto a semiconductor wafer. For this reason, no superposition distortion occurs on the projected patterns even when an integrated circuit pattern is projected on the same wafer by using various projection apparatuses. That is to say, according to the present invention, since any two projector apparata can be made interchangeable with each other, it is possible to greatly increase the pattern formation efficiency. Since, accordingly, the pattern formation cost can be reduced, the method of the invention is very useful in the manufacture of semiconductor integrated circuit.

Furthermore, it is possible to easily produce the projection mask for each projector apparatus, if a projection-distortion measuring function is imported to an electron beam exposure apparatus which forms the projection mask. The electron beam exposure apparatus stores in a memory the correction data used for correcting various projection distortions. A mask is produced to have projection distortions corrected with the use of such correction data.

DESCRIPTION OF THE DRAWINGS

Other objects and advantages will be apparent from the following description taken in conjunction with the accompanying drawings in which:

FIG. 7 is a block circuit diagram showing the deflection control circuit of the electron beam exposure apparatus shown in FIG. 6.

DETAILED DESCRIPTION OF THE PREFERRED EMBODIMENTS

Figure 1:
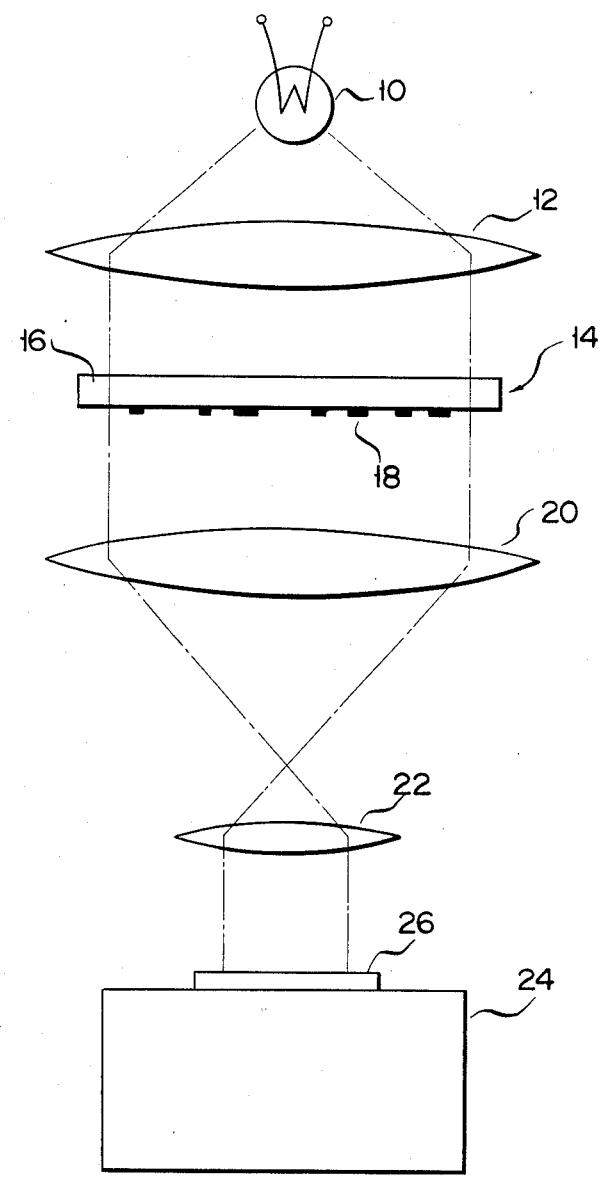
FIG. 1 is a schematic view of an optical reduction projection aligner apparatus used in an embodiment of the present invention.

FIG. 1 schematically shows a typical optical reduction projection aligner apparatus, or optical reduction projector apparatus which is used in the method of the present invention. Light beams emitted from a light source 10 become parallel to each other by means of a lens 12, and then are irradiated onto a projection mask 14. The mask 14 used in this embodiment has a projection pattern 18 consisting of a light-absorbing material such as, for example, chromium, which is formed on the underside of, for example, a transparent basic glass plate 16. Light passed through the mask 14 is partly interrupted by the projection pattern 18. The method of forming the projection pattern 18 on the mask 14 will be described later. Light passed through the mask 14 is focussed by a lens 20, is made parallel by a lens 22, and thus is irradiated onto a semiconductor wafer 26 placed on a table 24. On the upper surface of the wafer 26, a photo-resist film is applied. By the irradiation of said light, the photo-resist film is exposed corresponding to the projection pattern formed on the mask 14. Thus, a desired pattern can be projected onto the wafer 26. Here in this specification, the projection reduction ratio of this apparatus is defined as being 1:10.

When the projection pattern 18 on the mask 14 is transferred on the semiconductor wafer 26 by the projector apparatus having the above-mentioned construction, the projection distortion peculiar to the apparatus appears in the pattern formed on the semiconductor wafer.

Figure 2:
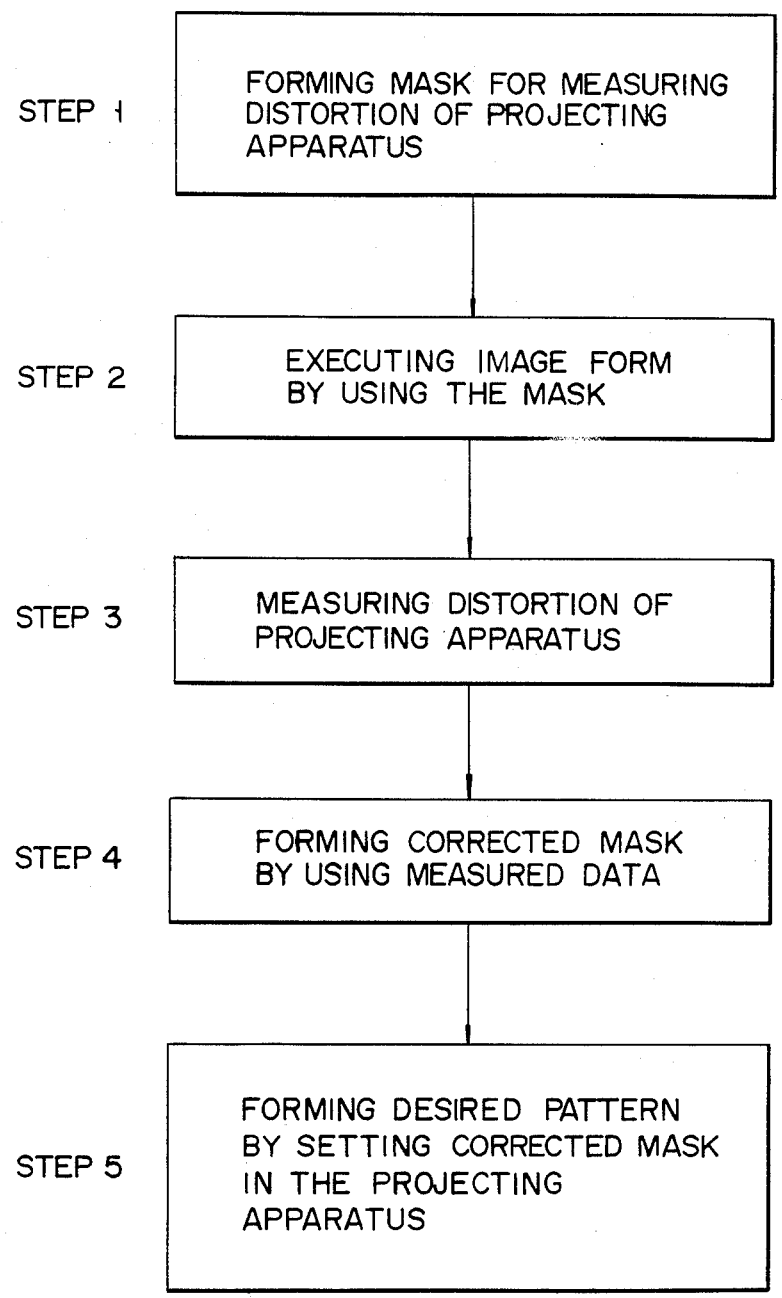
FIG. 2 is a flow chart showing the steps of the pattern projection method of the present invention.
Figure 3:
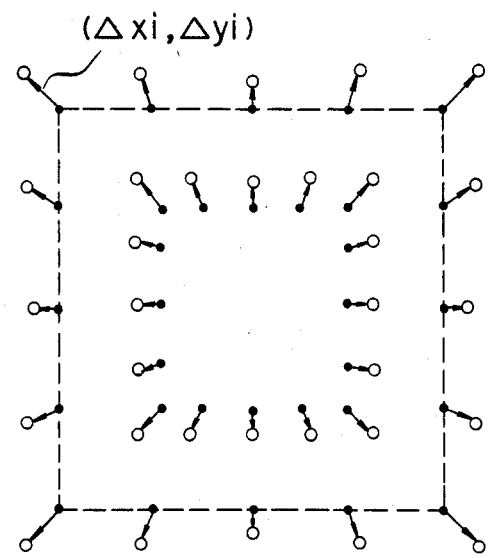
FIG. 3 is a view showing the projection distortions of the projector apparatus shown in FIG. 1.
Figure 4:
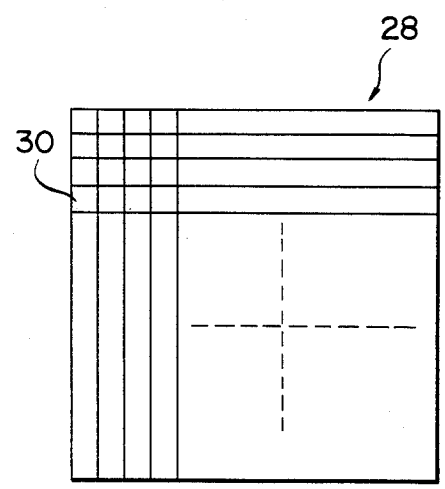
FIG. 4 is a view of an original pattern divided in the form of a mesh.
Figure 5:
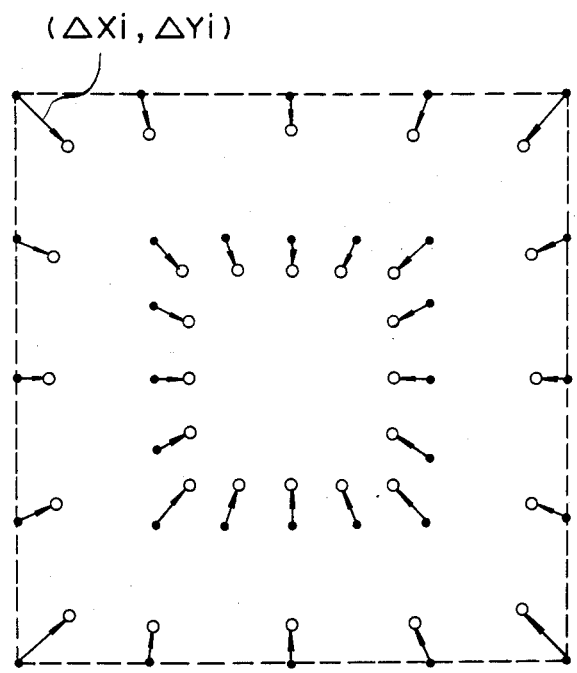
FIG. 5 is a view of a projection pattern having its position corrected.

A method of projecting a pattern according to the present invention will now be described with reference to FIG. 2. As shown in the step 1, a mask, having cross-shaped measuring marks, arranged in a matrix, is formed to measure the distortion peculiar to the projector apparatus involved. Next, in the step 2, the pattern is projected onto a first wafer 26 by using this mask in place of the above-mentioned mask 14, thereby forming measuring marks. Next, in the step 3, as described in the article by D. Cumming, "Proceeding of Microcircuit Engineering," 1980, p. 75, the position of the marks formed on the first wafer 26 can be measured by an optical length-measuring device which uses laser beams, for example, the coordinate measuring device of the light wave interference type made by Nippon Kohgaku Company Limited. Thus, the projection distortion of a projector apparatus can be measured, as shown in FIG. 3. In FIG. 3, each black dot indicates the position at which the mark should be formed. On the other hand, each white dot indicates the position at which the mark has been actually formed. Each arrow mark represents the amount of distortion ($\Delta xi$, $\Delta yi$). Next, in the step 4, a projection pattern is formed on the projection mask using the measured projection distortions ($\Delta xi$, $\Delta yi$) as follows. As shown in FIG. 4, an original pattern 28 is divided in a mesh; the data of the measured projection distortion is interpolated or extrapolated for each square 30 of the mesh; and the amount of correction is computed by a computer. Since, as stated before, the apparatus has a projection reduction ratio of 1/10, the amount of correction or opposite distortion is ($-10\Delta xi$, $-10\Delta yi$). Subsequently, the integrated circuit pattern data (design data) in the CAD system is divided in accordance with the mesh, and the figure data for each square 30 thus obtained has its position corrected so as to cancel the projection distortion. The computation involved in this correction operation is conducted by software processing. By using the pattern data of an integrated circuit (the data obtained after such a correction is made), the projection pattern 18 is formed on the mask 14 by means of a known electron beam exposure apparatus. The projection pattern thus formed is one which has been position-corrected as shown in FIG. 5. Each black dot indicates the pattern formation position based on the design data while, on the other hand, each white dot indicates the pattern formation position based on the corrected data. Each arrow mark illustrated represents the amount of correction ($-10\Delta xi$, $-10\Delta yi$).

Next, in the step 5, the mask 14 having the projection pattern 18 is set in the projector apparatus, to project a pattern onto a second semiconductor wafer 26 having a same shape as the first semiconductor wafer 26. By so doing, the projection distortion peculiar to the apparatus itself does not appear on the projected pattern.

As mentioned above, according to the present invention, it is possible to prevent the distortion peculiar to any projector apparatus from appearing on the pattern transferred on the second semiconductor wafer 26. Accordingly, it is possible to project a pattern with high precision. For this reason, even when a pattern is projected by more than one projector apparatus, no displacement occurs between the superposed patterns. Accordingly, it is possible to remarkably increase pattern formation efficiency. Note the following. When more than one projector apparatus is used, it is of course necessary to correct the projection pattern 18 of the mask 14 to correspond to the projection distortions peculiar to each projector apparatus. According to this embodiment, there is no need to improve the projector apparata themselves, but only the projection pattern 18 of the mask 14. For this reason, the method of the present invention provides a way of reducing the cost as well as a way of easily forming an integrated circuit pattern on a semiconductor wafer.

Figure 8:
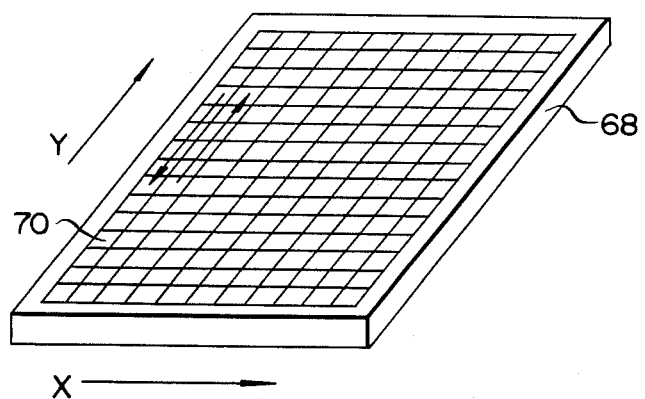
FIG. 8 is a view showing the manner of exposing to electron beams the basic mask plate mounted in the electron beam exposure apparatus shown in FIG. 6.

The method of projecting patterns according to another embodiment of the present invention will now be described with reference to FIGS. 6 to 8. As in the preceding embodiment, a projection distortion measuring mask is formed to measure the projection distortion peculiar to each projector apparatus used. The mask has cross-shaped marks arranged in a matrix. With the use of this mask, a pattern is projected onto a semiconductor wafer by means of a projector apparatus. Subsequently, in this second embodiment, the measurement of the projection distortions, as well as the production of the pattern projection mask is conducted by use of an electron beam exposure apparatus. The steps involved will now be described in detail.

Figure 6:
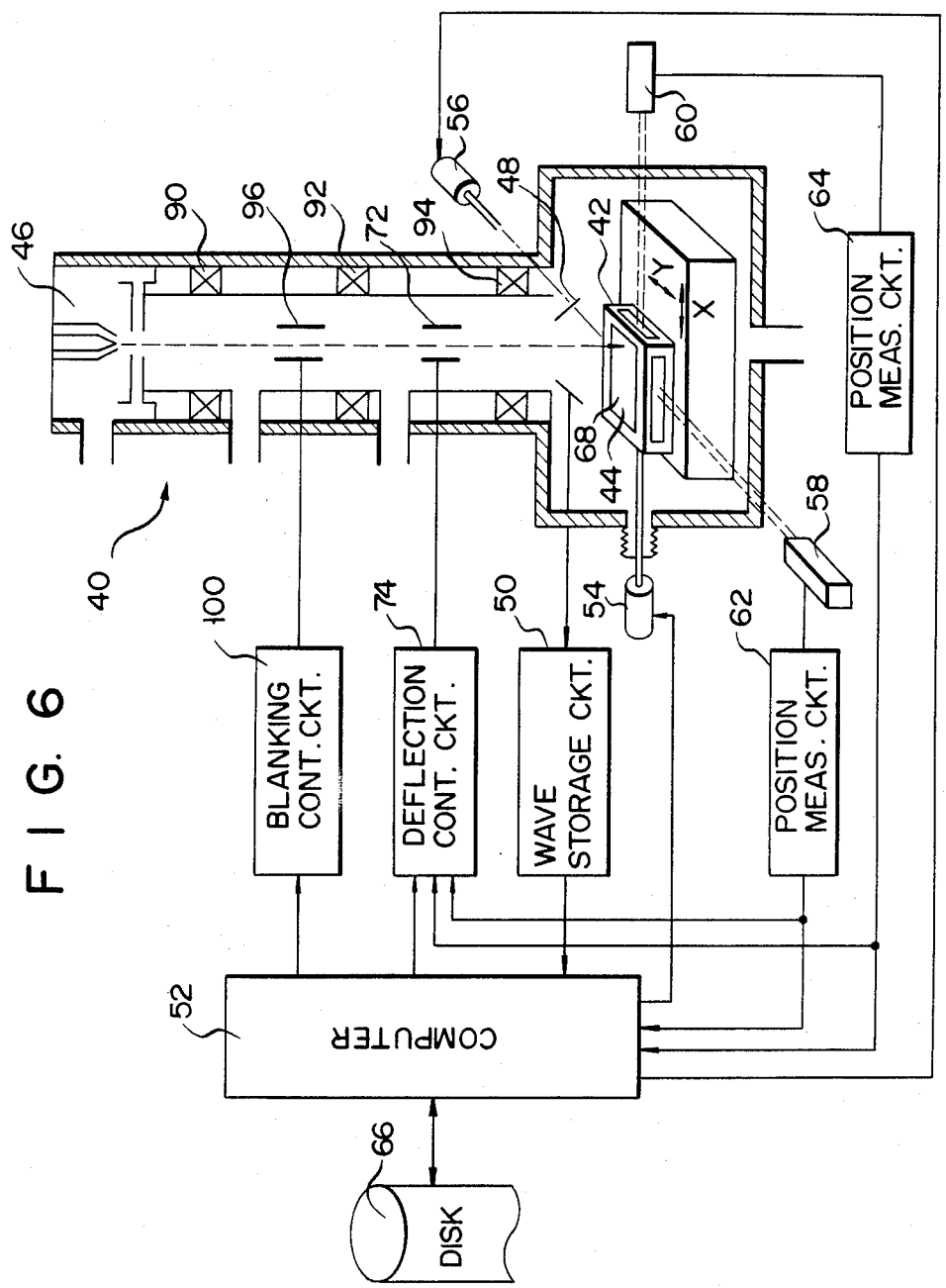
FIG. 6 is a schematic view of the electron beam exposure apparatus used for another embodiment of the present invention.

FIGS. 6 and 7 show an electron beam exposure apparatus 40, which is equivalent to the apparatus disclosed in U.S. Pat. No. 4,063,103, and which is, more specifically, EBM 130/40 of Toshiba Kikai Kabushikikaisha. First of all, a semiconductor wafer 44, having the cross-shaped measuring marks, is placed on a carriage 42 of the electron beam exposure apparatus 40 in order that the position of the marks formed on the semiconductor wafer can be measured. The electron beams emitted from an electron gun 46 are irradiated onto the wafer 44. Those electron beams reflected from the wafer are sensed by means of a reflected electron beam sensor 48. The resultant detection signal is converted from an analog to a digital signal by a wave storage circuit 50 and is then supplied to a computer 52. Electronic motors 54 and 56 begin to rotate upon receipt of the control signals supplied from the computer 52, and to move the carriage 42 in X and Y directions. The position of this carriage 42 is measured by, for example, laser interferometers 58 and 60. The output signals from the laser interferometers 58 and 60 are converted into pulse signals by the carriage position measuring circuits 62 and 64, respectively. These pulse signals are then supplied to the computer 52. By using the output signal from the wave storage circuit 50 as well as the output signals from the carriage position measuring circuits 62 and 64, the position of the marks formed on the wafer can be determined by the computer 52.

Next, by computing the difference between the position of the mark as it should be if the projector apparatus had no projection distortion and the position of the mark as it actually was formed, the amount of projection distortion ($\Delta xi$, $\Delta yi$) peculiar to the projector apparatus itself is determined by the computer. By interpolating or extrapolating the data ($\Delta xi$, $\Delta yi$) of the measured projection distortion in the same manner as in the preceding embodiment, the amount of correction or opposite distortion ($\Delta Xi$, $\Delta Yi$) per each square area of the mesh is computed by the computer 52.

When it is now assumed that the projector apparatus has a projection reduction ratio or magnification of k, then the said amount of correction ($\Delta Xi$, $\Delta Yi$) is expressed as follows.

$$\Delta Xi = -\frac{1}{k} \Delta xi$$

$$\Delta Yi = -\frac{1}{k} \Delta yi$$

This amount of correction ($\Delta Xi$, $\Delta Yi$) is stored in a magnetic disc 66 of the computer 52 as correction data.

After that, the wafer 44 on the carriage 42 is removed. In its place, a basic mask plate 68 is mounted and is irradiated by electron beams. Thus, a projection pattern is formed on the basic mask plate 68. This electron beam delineation is done by what is called a "raster scan" system wherein, as shown in FIG. 8. The beams are scanned in the X direction while the carriage 42 is continuously moved in the Y direction which intersects the X direction at a right angle, thereby delineating the belt-like region of the basic mask plate 68. Each square area 70 formed by dividing the surface of the basic mask plate 68 into a grid as shown in FIG. 8 indicates the individual unit used for correcting the projection distortion. Before delineating the belt-like region, the projection distortion correction data or opposite distortion of the corresponding belt-like region are transferred from the magnetic disc 66 of the computer 52 to the projection-distortion correction data memory 76 of the deflection control circuit 74 to control the scanning deflection plate 72. When the carriage 42 is moved and thus is brought to the delineation position, a synchronous signal Q for starting the deflection is sent from the carriage position measuring circuits 62 and 64 to the projection distortion correction data memory 76 through an address counter 78. Projection-distortion correction data is produced for each square area 70. This data is read from the projection-distortion correction data memory 76 and is latched by a latch circuit 80. The correction data of the latch circuit 80 is added by an adder 82 to a deflection position control data or delineation position data R based on the position of the carriage. The corrected delineation position data thus obtained is supplied to the scanning deflection plate 72 through a deflection starting position D/A converter 84 and then through a deflection signal generator 86. A saw-tooth like corrected deflection signal is applied to the deflection plate 72, to correct the deflection starting position.

Meanwhile, electron beams emitted from the electron gun 46 are irradiated and focussed onto the basic mask plate 68 placed on the carriage 42, through lenses 90, 92 and 94; blanking plate 96; and scanning deflection plate 72. The data of the integrated circuit pattern to be formed on the basic mask plate 68 is transferred to a blanking control circuit 100 from the computer 52. In the blanking control circuit 100, the integrated circuit pattern is converted to a "0" bit or "1" bit, which is then supplied to the blanking plate 96. Accordingly, electron beams passed through the blanking plate 96 have their deflection starting positions corrected by a correction deflection signal applied to the deflection plate 72 as mentioned above, and thus are irradiated and focussed onto the basic mask plate 68.

It should be noted here that, while each individual square area 70 is scanned N times, the projection distortion correction data with respect to each minute or square area 70 has a specified or constant value. Accordingly during the scanning period, the same correction data is held in the latch circuit 80. When the synchronous signal Q is supplied N times, the content of the address counter 78 is renewed, and the correction data corresponding to the next minute area 70 is read from the projection-distortion correction data memory 76 and is supplied to the latch circuit 80. In this way, the projection distortion correction data is sequentially read from the correction data memory 76, according to the raster scanning operation of sequentially delineating the belt-like region for each square area 70 as shown in FIG. 8. Thus, the desired projection pattern can be formed in part on the basic mask plate 68. The entire process of forming a projection pattern includes coating a resist onto the surface of a glass plate coated with, for example, chromium (Cr) and patterning the resist with the above-mentioned electron beam exposure and, thereafter, etching the chromium layer by using the remaining resist as a mask.

In the next step, by using the mask 68 formed with the projection pattern in the above-mentioned manner, the pattern is transferred onto another semiconductor wafer by means of the above-mentioned projector apparatus. Since, as mentioned above, this projection pattern is formed in such a way as to cancel the distortion peculiar to the projector apparatus itself, only a small amount of distortion will appear in the pattern thus projected onto the semiconductor wafer. In this second embodiment as well, the same effect as that of the preceding embodiment has been obtained.

The present invention is not limited to the above-mentioned embodiments. For example, the use of the electron beam exposure apparatus is not limited to the raster scan system, but may be done by the vector scan system, etc. The electron beam delineation may be effected for each square area by a step and repeat method. The electron beam may be delineated by continuously moving the semiconductor wafer. The construction of the exposure apparatus may be changed into any other suitable construction. The projector apparatus may be projector apparatus having a projection ratio 1:1. Further, the projector apparatus used in the present invention may also be replaced by an electron beam projector apparatus, i.e., an apparatus for receiving light on a photoelectric conversion mask to obtain an electron beam pattern which is projected onto a semiconductor wafer. Or, the projector apparatus used in the present invention may also be an X-ray projector apparatus for projecting X rays.

What is claimed is:

1. A method of forming by projection an integrated circuit pattern on first semiconductor wafer, comprising the steps of:
   irradiating radiant rays onto a mask provided with a plurality of reference marks by the use of a projector apparatus which is used to form the integrated circuit pattern of said first semiconductor wafer so as to project said plurality of reference marks onto a second semiconductor wafer;
   measuring the projection distortions peculiar to said projector apparatus by measuring the positions of said reference marks projected onto said second semiconductor wafer;
   producing a projection mask for use in the formation of the integrated circuit pattern by using the measured projection distortion, said projection mask being formed by being given an opposite distortion so as to offset the projection distortion peculiar to said projector apparatus, wherein said step of producing the projection mask comprises using an electron beam exposure apparatus to perform the steps of storing in a memory said opposite distortion values ($\Delta Xi$, $\Delta Yi$) produced in accordance with said projection distortion ($\Delta xi$, $\Delta yi$), adding said opposite distortion values obtained by measuring the positions of said reference marks stored in said memory to the delineating position data corresponding to a design pattern constituting the integrated circuit pattern so as to obtain corrected delineating position data, and using a deflection signal generating circuit to change an amount of deflection of the electron beam in accordance with said corrected exposure position data; and
   mounting the projection mask on said projector apparatus and irradiating radiant rays onto said projection mask so as to form the integrated circuit pattern onto the first semoconductor wafer.

2. The method according to claim 1, wherein said projection distortion measuring step comprises the substeps of:
   mounting in said projector apparatus the projection distortion measuring mask formed with a plurality of marks in the form of a matrix;
   projecting said marks of said projection distortion measuring mask onto the second semiconductor wafer; and
   measuring a difference between the position of each mark formed on the second semiconductor wafer and the position at which said mark should be formed so as to measure the projection distortion ($\Delta xi$, $\Delta yi$) made on each position of the second semiconductor wafer.

3. The method according to claim 2, wherein said projection mask producing step comprises the substep wherein, when said projector apparatus is assumed to have a projection magnification of k, an opposite distortion $$\left( -\frac{1}{k} \Delta xi, -\frac{1}{k} \Delta yi \right)$$

is imparted beforehand to the integrated circuit pattern on the projection mask.

4. The method according to claim 2, wherein said substep of measuring said difference between the position of each mark formed on the second semiconductor wafer and the position at which said mark should be formed is executed with the use of said electron beam exposure apparatus by:
   irradiating electron beams onto the second semiconductor wafer having said plurality of reference marks projected thereon;
   detecting electrons reflected from the second semiconductor wafer so as to detect the mark position thereon; and
   measuring the difference between the mark position and the mark position to be formed.

5. The method according to claim 1, wherein said projector apparatus is an optical projector apparatus for light exposure.

6. The method according to claim 1, wherein said projector apparatus is an electron beam projector apparatus for receiving light on a photoelectric conversion mask to obtain an electron beam pattern and projecting the electron beam pattern.

7. The method according to claim 1, wherein said projector apparatus is an X-ray projector apparatus for projecting X rays.

8. A method of forming by projection an integrated circuit pattern on a first semiconductor wafer, comprising the steps of:
   mounting, in a projector apparatus which is used to form the integrated circuit pattern on the first semiconductor wafer, a projection distortion measuring mask formed with a plurality of reference marks in the form of a matrix;
   irradiating radiant rays onto said mask and exposing the same so as to transfer said plurality of reference marks onto a second semiconductor wafer;
   detecting the positions of said reference marks transferred onto the second semiconductor wafer to determine the displacement thereof from the positions at which said reference marks are to be formed;
   measuring the projection distortions peculiar to said projector apparatus, with respect to each square area of the matrix defined by said projected reference marks;
   correcting previously set integrated circuit pattern data so as to cancel the projection distortion per said square area peculiar to said projector apparatus;
   producing a projection mask used to form the integrated circuit pattern, by using an electron beam exposure apparatus, including performing the steps of storing in a memory opposite distortion values ($\Delta Xi$, $\Delta Yi$) produced in accordance with said projection distortion ($\Delta xi$, $\Delta yi$), adding said opposite distortion values (ΔXi, ΔYi) stored in said memory to the delineating position data corresponding to a design pattern constituting the integrated circuit pattern so as to obtain a corrected delineating position data, and using a deflection signal generating circuit to change an amount of deflection of the electron beam in accordance with said corrected delineating position data; and mounting said projection mask in said projector apparatus and irradiating said radiant rays thereto so as to project the integrated circuit pattern onto the first semiconductor wafer.

9. The method according to claim 8, wherein an electron beam delineation by said electron beam exposure apparatus is effected for each square area by a step and repeat method.

10. The method according to claim 8, wherein electron beam delineation is effected by continuously the second semiconductor wafer.

* * * * *